United States Patent
Takafuji et al.

(10) Patent No.: US 7,488,980 B2
(45) Date of Patent: Feb. 10, 2009

(54) THIN FILM SEMICONDUCTOR DEVICE AND FABRICATION METHOD THEREFOR

(75) Inventors: Yutaka Takafuji, Nara (JP); Takashi Itoga, Nara (JP); Yasuyuki Ogawa, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 952 days.

(21) Appl. No.: 10/940,735

(22) Filed: Sep. 15, 2004

(65) Prior Publication Data

US 2005/0067619 A1 Mar. 31, 2005

(30) Foreign Application Priority Data

Sep. 18, 2003 (JP) ............... 2003-325781

(51) Int. Cl.
- H01L 29/04 (2006.01)
- H01L 31/036 (2006.01)
- H01L 27/01 (2006.01)
- H01L 27/12 (2006.01)
- H01L 31/0392 (2006.01)

(52) U.S. Cl. ............... 257/64; 257/66; 257/347
(58) Field of Classification Search ............. 257/64–75, 257/347–354

See application file for complete search history.

(56) References Cited

U.S. PATENT DOCUMENTS

| | | | |
|---|---|---|---|
| 4,612,083 A | 9/1986 | Yasumoto et al. | |
| 5,589,419 A | 12/1996 | Ochiai | |
| 5,637,187 A | 6/1997 | Takasu et al. | |
| 6,067,062 A | 5/2000 | Takasu et al. | |
| 6,191,007 B1 | 2/2001 | Matsui et al. | |
| 6,355,501 B1 | 3/2002 | Fung et al. | |
| 6,392,253 B1* | 5/2002 | Saxena | 257/59 |
| 6,429,484 B1* | 8/2002 | Yu | 257/347 |
| 6,503,778 B1 | 1/2003 | Yamauchi et al. | |
| 6,590,227 B2* | 7/2003 | Ishikawa | 257/68 |
| 7,387,919 B2* | 6/2008 | Kwak et al. | 438/153 |
| 7,408,193 B2* | 8/2008 | Ishikawa | 257/59 |
| 2002/0030189 A1 | 3/2002 | Ishikawa | |

FOREIGN PATENT DOCUMENTS

EP 1 453 093 A1 9/2004

(Continued)

OTHER PUBLICATIONS

Sailer et al, "Creating 3D Circuits Using Transferred Films", IEEE Circuits and Devices Magazine, IEEE Service Center, Piscataway, NJ, vol. 13, No. 6, Nov. 1997, pp. 27-30.

(Continued)

*Primary Examiner*—Cuong Q Nguyen
(74) *Attorney, Agent, or Firm*—Nixon & Vanderhye, P.C.

(57) ABSTRACT

A relaying pad is formed in a predetermined portion in an insulation layer of the single-crystal thin film device, in a region where the single-crystal thin film device is formed. The relaying pad is for providing connection wiring through the insulator substrate. With this configuration it is possible to prevent an increase in an aspect ratio of a contact hole formed in an insulation layer in a region in which a transferred device is formed, the semiconductor device including a substrate on which the transferred device and a deposited device coexist.

6 Claims, 4 Drawing Sheets

FOREIGN PATENT DOCUMENTS

| | | |
|---|---|---|
| JP | 59-48950 A | 3/1984 |
| JP | 5-41478 A | 2/1993 |
| JP | 5-267563 A | 10/1993 |
| JP | 8-139333 A | 5/1996 |
| JP | 11-24106 A | 1/1999 |
| WO | 93/15589 A1 | 8/1993 |
| WO | 03/041167 A1 | 5/2003 |

OTHER PUBLICATIONS

Salemo et al, "Single Crystal Silicon AMLCDs", Conference Record of the 1994 International Display Research Conference (IDRC), 1994, pp. 39-44.

Tong et al; "Semiconductor Wafer Bonding: Science and Technology", John Wiley & Sons, Inc., 1999.

* cited by examiner

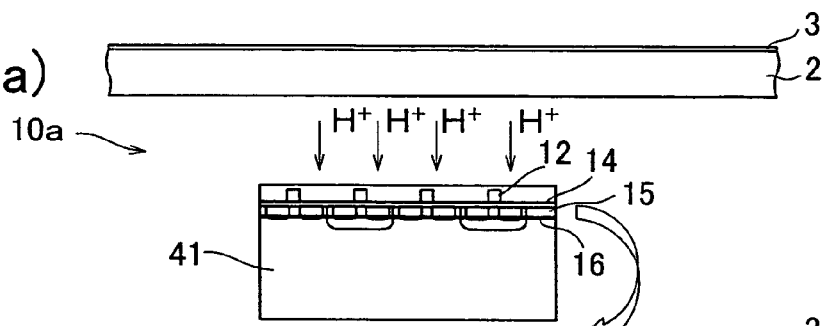
FIG. 3 (a)
FIG. 3 (b)
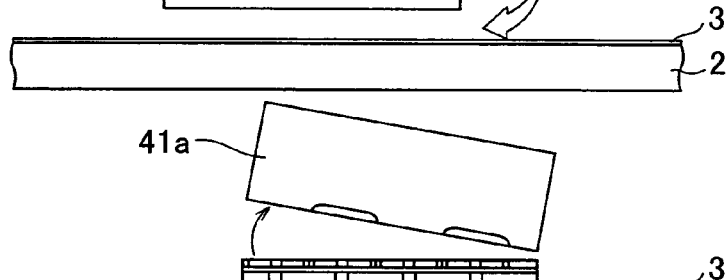
FIG. 3 (c)
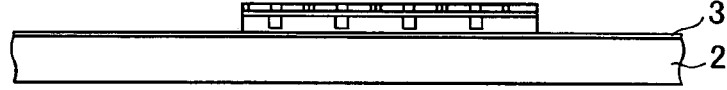
FIG. 3 (d)
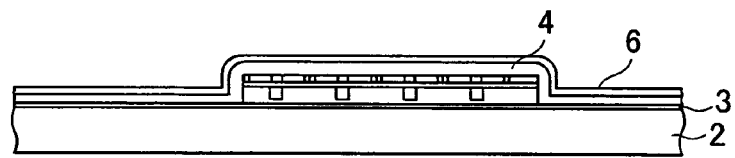
FIG. 3 (e)
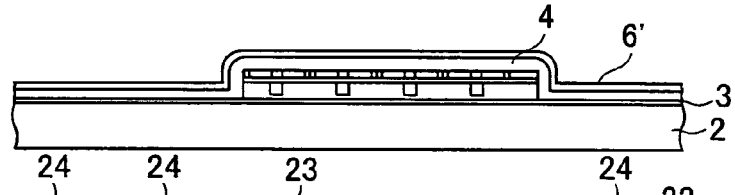
FIG. 3 (f)
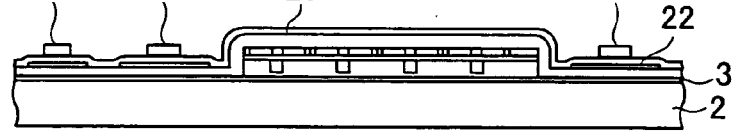
FIG. 3 (g)
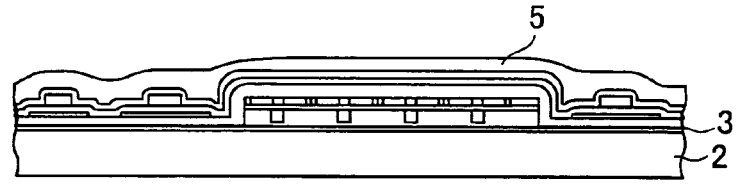
FIG. 3 (h)
FIG. 3 (i)
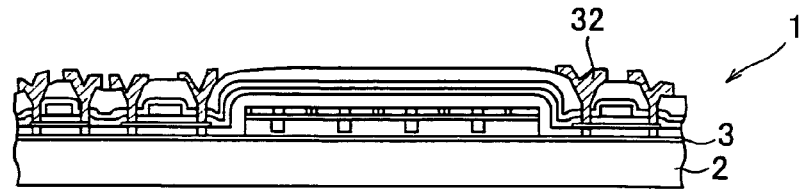

THIN FILM SEMICONDUCTOR DEVICE AND FABRICATION METHOD THEREFOR

This Nonprofisional application claims priority under 35 U.S.C. § 119(a) on Patent Application No. 2003/325781 filed in Japan on Sep. 18, 2003, the entire contents of which are hereby incorporated by reference.

FIELD OF THE INVENTION

The present invention relates to a thin film semiconductor device and a fabrication method therefor for used in, for example, a liquid crystal display device which is driven by TFTs in an active matrix manner. The present invention is for improving a circuit performance in such a liquid crystal display device in which a peripheral driving circuit, a control circuit, and other circuits are integral with each other and are integrated into a single substrate.

BACKGROUND OF THE INVENTION

A display device in which a liquid crystal panel or an organic EL (electro luminescent) panel is driven by thin film transistors (hereinafter referred to as TFTs) in so-called an active matrix manner has been used recently. In such a display device, there is provided on its glass substrate with the TFTs made of amorphous silicon (hereinafter referred to as a-Si) or polycrystalline silicon (hereinafter referred to as p-Si).

Among others, peripheral drivers which are integrated by employing the p-Si whose mobility is large enough for a high-speed operation have been widely used. However, a silicon device having a higher performance has been demanded, in order to integrate a system, such as an image processor or a timing controller, in which a higher performance is required.

This is because the performance of the transistor made of p-Si is insufficient to form the silicon device having a higher performance. Such insufficient performance attributes to (i) a localized level in the band gap caused by incomplete crystallinity, and/or (ii) the decrease in the mobility and/or the increase in an S-coefficient (subthreshold coefficient), each caused by defect around the crystal grain boundary and in the crystal.

In view of the circumstances, research has been made on a technology to form a silicon device having a higher performance (e.g. WO publication WO93-15589 (published on Aug. 5, 1993), J. P. Salerno, Single Crystal silicon AMLCDs, Conference Record of the 1994 International Display Research Conference(IDRC) p.39-44(1994). In the technology, preliminary formed is a device having thin film transistors made of a single-crystal silicon thin film, or the like. This device is adhered on an insulator substrate, so that a semiconductor device is formed.

The WO publication WO93-15589 discloses that a display of a display panel in an active matrix type liquid crystal device is prepared with the use of a semiconductor device in which preliminary-made single-crystal silicon thin film transistors are transferred onto a glass substrate via an adhesive agent.

Further, Japanese Unexamined Patent publication No. 11-24106/1999 (published on Jan. 29, 1999) discloses another technology for forming a high-performance semiconductor device. This publication discloses a substrate for liquid crystal panel-use in which two kinds of the semiconductor devices, each having a different property, are formed on a single substrate. According to the substrate for liquid crystal panel-use disclosed in the publication No. 11-24106/1999, polycrystalline silicon TFTs formed on one substrate are transferred to another substrate on which pixel regions with amorphous silicon TFTs have been formed.

However, the configuration, in which two kinds of semiconductor devices coexist on the insulator substrate, disclosed in the publication No. 11-24106/1999 gives rise to the following problems. One of the two kinds of semiconductor devices indicates devices (transferred device) such as transistors which are formed by transferring from another substrate. The other one indicates devices (deposited device which is a semiconductor device formed on the insulator substrate whose semiconductor film is formed by thin film deposition such as PECVD) such as transistors in which a semiconductor layer, formed on the insulator substrate by deposition or the like, are used as an active layer.

The semiconductor device includes various kinds of insulation films, such as gate insulation films, an interlayer insulator film, and so on. Namely, an insulation film of the transferred device and an insulation film of the deposited device are laminated in a region, in which the transferred device is formed, on the substrate on which the two kinds of semiconductor devices are arranged. As a result, such a region where the transferred device is formed has a thickness greater than that of a substrate having only a single kind of semiconductor device.

In part of the semiconductor devices, particularly in a substrate in which a semiconductor and a metal wiring layer are incorporated, contact holes are usually provided in an insulation layer, and the semiconductor and the metal wiring layer are electrically connected, via the contact holes, to metal wiring in a region other than the region where the semiconductor and the metal wiring layer are provided. However, the contact holes in the insulation layer are ordinarily formed by etching. As such, it is difficult to prevent an increase in a diameter of the contact hole, in cases where the insulation layer is thick, i.e., in cases where a hole depth of the contact hole is deep. This results in an increase in an aspect ratio of the contact hole, thus causing a disadvantage for high-density integration of circuits.

SUMMARY OF THE INVENTION

An object of the present invention is to provide a semiconductor device which can prevent an increase in an aspect ratio of a contact hole formed in an insulation layer in a region in which a transferred device is formed, the semiconductor device including a substrate on which (i) a transferred device which is a semiconductor device formed by transferring devices to an insulator substrate from a semiconductor substrate in which a part of device configuration has been incorporated, and (ii) a deposited device which is a semiconductor device formed on the insulator substrate whose semiconductor film is formed by a deposition process, coexist.

In order to achieve the foregoing object, A thin film semiconductor device, including:
  an insulator substrate including (i) a single-crystal thin film device having an active layer made of a single-crystal silicon, and (ii) a non-single-crystal silicon thin film device having an active layer made of a non-single-crystal silicon;
  a contact hole, and
  a relaying pad formed in a predetermined portion in an insulation layer of the single-crystal thin film device, in a region where the single-crystal thin film device is formed,
  the relaying pad being connected, via the contact hole, with metal wiring or its equivalent wiring which is connected with a predetermined position of a single-crystal layer of the single-crystal thin film device.

According to the semiconductor device, in the formation region of the single-crystal thin film device, the single-crystal thin film device is connected to the metal wiring in the non-single crystal silicon device having the active layer made of the polycrystalline silicon or the like formed on the insulator substrate. As such, it is required that the contact hole be so provided as to penetrate all of the insulation layers in the formation region, and that the connection wiring be provided in the contact hole.

To meet the requirements, in the foregoing configuration, the contact hole is provided so as to be divided, by the relaying pad, into two parts, one extending upwards and the other extending downwards with respect to the relaying pad provided in the insulation layer, instead of forming the contact hole penetrating all of the insulation layer in the formation region of the transferred device. As such, the diameter of the contact hole can be made smaller than that of the contact hole penetrating all of the insulation layer without the relaying pad, thereby restraining the aspect ratio of the contact hole, and thereby reducing the size of the contact hall. This gives rise to an advantageous in high-density integration of circuits. Further, the contact hole becomes shallow. This allows reduction of the occurrences of problems such as connection failure of the connection wiring within the contact hole.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 3(a) through FIG. 3(i) are cross sectional views showing steps of fabricating the semiconductor device shown in FIG. 1.

DESCRIPTION OF THE EMBODIMENTS

An embodiment in accordance with the present invention is described as follows with reference to drawings.

A thin film semiconductor device which the present embodiment deals with is a semiconductor device, suitable for high performance and high functionality, in which (i) a MOS non-single-crystal silicon thin film transistor, and (ii) a MOS single-crystal silicon thin film transistor are provided in different regions on an insulator substrate. Such semiconductor device is arranged on an active matrix substrate using TFTs (thin film transistors).

This MOS thin film transistor is a popular transistor including an active semiconductor layer, a gate electrode, a gate insulation layer, and a highly-concentrated impurity doped sections (source electrode, and drain electrode) provided on both sides of the gate. In such a MOS thin film transistor, carrier concentration of the semiconductor layer below the gate is modulated in accordance with a voltage applied to the gate electrode. This allows controlling of current flowing between the source and the drain.

A characteristic of the MOS transistor resides in that, when the MOS transistors are arranged to have a CMOS (Complementary MOS) configuration, the power consumption is reduced, and that an output can be swung up to a level substantially equal to an applied power supply voltage. As such, the MOS transistor is suitable for a logic circuit with low-power consumption.

Figure 1:
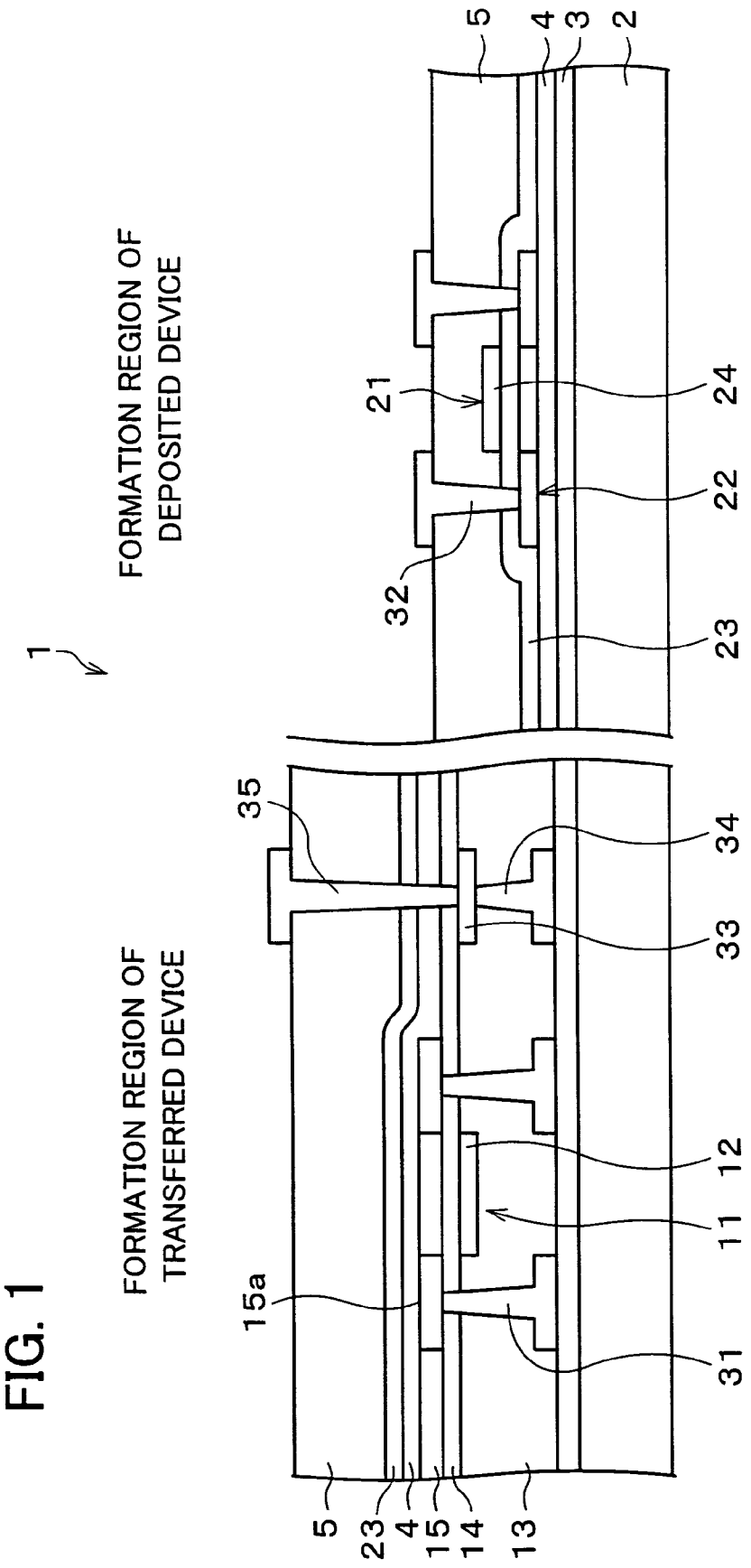
FIG. 1 is a cross sectional view showing a schematic configuration of a semiconductor device of an embodiment in accordance with the present invention.

As shown in FIG. 1, a semiconductor device 1 of the present embodiment includes an $SiO_2$ (silicon dioxide) film 3 provided on an insulator substrate 2. The semiconductor device 1 further includes, on the $SiO_2$ film 3, a single-crystal silicon thin film transistor 11 (a transferred device) and a polycrystalline silicon thin film transistor 21 (a deposited device).

Used as the insulator substrate 2 is code 1737 (alkaline earth—almino borosilicate glass), produced by Corning, with a high-deformation point. It is possible to adopt other glass having a high-deformation point as the insulator substrate 2 when carrying out the present invention.

The $SiO_2$ film 3 is formed on an entire surface of the insulator substrate 2, with a film thickness of approximately 50 nm.

The single-crystal silicon thin film transistor 11 includes a gate electrode 12, a planarizing layer 13, a gate insulation film 14 made of an $SiO_2$ film, and a single-crystal silicon thin film 15 including a semiconductor layer 15a of the single-crystal silicon thin film transistor 11.

Further, before the single-crystal silicon thin film transistor 11 is bonded with the insulator substrate 2, at least a part of the single-crystal silicon thin film transistor 11 is formed on a single-crystal silicon substrate, and a portion to become the single-crystal silicon thin film transistor 11 is bonded with the insulator substrate 2 while including the gate insulation film 14 and the single-crystal silicon thin film 15. When comparing (i) the case where the gate electrode is formed on the single-crystal silicon substrate, and where impurity ion implantation is carried out with respect to the source and the drain with (ii) the case where the thin film transistor is formed after the single-crystal silicon film is formed on the insulator substrate 2, it is easier to carry out micro-fabrication or activation with respect to the single-crystal silicon in the former case (i) than in the latter case (ii). Under a predetermined energy and a predetermined concentration, the implantation of hydrogen ion, or the implantation of hydrogen ion plus rare gas ion such as He gas ion is carried out with respect to the single-crystal silicon substrate. The single-crystal silicon substrate thus implanted is bonded with an insulator substrate made of glass or other material, and undergoes a heat treatment. This causes cleavage and separation to occur from the portion to which the ion implantation has been carried out, so that the single-crystal silicon thin film transistor 11 is transferred onto the insulator substrate 2.

The polycrystalline silicon thin film transistor 21 includes, on an interlayer insulator film 4 made of $SiO_2$ film, a polycrystalline silicon thin film 22 serving as the semiconductor layer of the polycrystalline silicon thin film transistor 21, a gate insulation film 23 made of an $SiO_2$ film, and a gate electrode 24. An interlayer planarizing insulation film 5 is further provided on the gate electrode 24. An interlayer insulator film 4, a gate insulation film 23, and an interlayer planarizing insulation film 5 are respectively formed also on the single-crystal silicon thin film transistor 11.

The gate electrode 24 is made of polycrystalline silicon and W silicide. However, the present embodiment is not limited to this. Alternatively, the gate electrode 24 may be made of polycrystalline silicon and other silicide or polycide, for example.

According to the semiconductor device 1 of the present embodiment, as described above, the MOS single-crystal silicon thin film transistor 11 and the MOS polycrystalline silicon thin film transistor 21 coexist on the single insulator substrate 2. As such, it is possible to realize a semiconductor device, having high performance and high functionality, in which a plurality of circuits, each having a different property, are integrated. Further, it is possible to realize a semiconductor device inexpensively, as compared with cases where transistors each made of a single-silicon film are formed on a single insulator substrate 2.

Further, the semiconductor device 1 of the present embodiment further includes the interlayer insulator film 4 made of the $SiO_2$ film, between the polycrystalline silicon thin film transistor 21 and the single-crystal silicon thin film transistor 11. As such, it is possible to prevent the single-crystal silicon thin film transistor 15 from being contaminated.

For example, in the case of an active matrix substrate of a liquid crystal device including a semiconductor device 1 of the present embodiment, SiNx (silicon nitride), a resin planarizing layer, a via hole, and a transparent electrode, are respectively formed for liquid crystal display use. Further, a driver section and TFTs for use in display section are provided in a region where the polycrystalline silicon thin film 22 is provided. A timing controller is provided in a region where the single-crystal silicon thin film 15, applicable to a device in which a higher performance is required, is provided. Note that the driver section may be made of single-crystal silicon. The material of the driver section may be determined, in view of costs and performance.

Thus, it is possible to realize thin film transistors having high-performance and high-functionality, by determining functions and usages of thin film transistors in accordance with properties of the thin film transistors made of the single-crystal thin film 15 and the polycrystalline thin film 22, respectively.

Note that, according to the active matrix substrate, for liquid crystal display use, in which the semiconductor device of the present embodiment is provided, N channel TFT, provided in a region where the single-crystal thin film 15 is provided, has mobility of approximately 550 $cm^2/Vsec$, whereas N channel TFT, formed in a region where the conventional polycrystalline silicon thin film, has mobility of approximately 100 $cm^2/Vsec$. Accordingly, with the configuration of the semiconductor device 1 of the present embodiment, it is possible to realize TFTs which can operate faster than the conventional configuration.

Further, in the active matrix substrate for liquid crystal display use, the timing controller 2, which is the device provided in the region where the single-crystal silicon thin film 15 is provided, stably operated at a voltage of 2.7V, whereas the device, provided in the region where the polycrystalline silicon thin film 22 is provided, as well as the driver, required signals of 7V to 8V and power supply voltage of 7V to 8V.

Further, in the semiconductor device 1, since the integrated circuits are provided in the regions where the polycrystalline silicon thin film 22 and the single-crystal silicon thin film 15 are respectively provided, it is possible to arrange an integrated circuit (IC) including a pixel array, in accordance with a required configuration and a required property. Moreover, it is possible to produce the integrated circuits, in the respective regions, whose operating speed, operating power supply voltage, and/or the like are different from each other. For example, it is possible to design the integrated circuits such that at least one of a gate length, a film thickness of the gate insulation layer, a power supply voltage, and a logic level is different from one region to another.

In this way, it is possible to form a device in which each of the regions has its own property. Thus, it is possible to realize a semiconductor device with more variety in functions.

Further, in the semiconductor device 1, the integrated circuits are provided in the regions where the polycrystalline silicon thin film 22 and the single-crystal silicon thin film 15 are respectively provided. As such, it is possible for the integrated circuits in the regions to be processed based on respective different fabrication rules. For example, when channel length is gradually made shorter in the polycrystalline silicon thin film, the fluctuation in properties of the TFTs rapidly increases, due to the smaller number of the crystal grain boundary in the channel. In contrast, when the channel length is gradually made shorter, the fluctuation in properties of the TFTs hardly increases because no crystal grain boundary exists in the region where the single-crystal silicon thin film is provided. Therefore, it is necessary to change a fabrication rule for each of the regions. It is possible to form each integrated circuit in a suitable region in accordance with each fabrication rule of such a region.

Further, according to the semiconductor device 1 of the present embodiment, it is possible to form a metal wiring pattern in the MOS single-crystal silicon thin film transistor 11, in accordance with a designing rule which is not as strict as that of a gate pattern.

Accordingly, it is possible to simultaneously process (i) metal wiring in a large-size substrate, and (ii) metal wiring, or a part of the metal wiring, of the semiconductor device having the MOS single-crystal silicon thin film transistor 11. This allows a restraint of cost rise, and an improvement in productivity. Further, this allows easy connection with external wiring, other circuit blocks, and/or a TFT array, thus reducing deterioration in product yield due to defective connection to an external circuit, or the like.

Note that a size of the single-crystal silicon thin film 15 is determined in accordance with a wafer size of an LSI fabrication circuit. Note also that a wafer size of a general LSI fabrication circuit is adequate for producing a logic, a timing generator, a high-speed DAC (current buffer), or a processor which necessitates the single-crystal silicon thin film 15. The logic and the timing generator operate at a high speed, and have low power consumption.

Further, in the semiconductor device 1 of the present embodiment, signals are supplied to the single-crystal silicon thin film transistor 11, via the metal wiring for the polycrystalline silicon thin film 21. Namely, as shown in FIG. 1, in a formation region of the single-crystal silicon thin film transistor 11, there is provided a contact hole in the planarizing layer 13. Connection wiring 34 via the contact hole allows connection of the metal wiring for the polycrystalline silicon thin film transistor 21 on the insulator substrate 2 with the source and drain of the single-crystal silicon thin film transistor 11, via a relaying pad 33.

Further, in a formation region of the polycrystalline silicon thin film transistor 21, there is provided the contact hole in which connection wiring 32 is provided. This contact hole penetrates the interlayer planarizing insulation film 5, and the gate insulation film 23 of the polycrystalline silicon thin film transistor 21. The signals are externally supplied to the polycrystalline silicon thin film transistor 21, via the connection wiring 32.

In order to connect the single-crystal thin film device with the metal wiring for the polycrystalline silicon thin film 21 formed on the insulator substrate 2, it is required that (i) the connection wiring be provided in the contact hole, and (ii) the contact hole be so arranged, in the formation region of the single-crystal silicon thin film transistor 11, that the contact hole penetrates all of the insulation layers of the formation region.

However, if the contact hole, penetrating all of the insulation layers of the formation region of the single-crystal silicon thin film transistor 11, is formed by a single etching, then the contact hole becomes excessively deep. This requires an increase in a diameter of the contact hole in order to achieve good contact. This causes a disadvantage from the viewpoint of high-density integration, as already mentioned in "BACKGROUND OF THE INVENTION".

In view of such a disadvantage, the semiconductor device 1 includes a relaying pad 33 formed in the layer where the gate electrode 12 of the single-crystal silicon thin film transistor 11 is provided. A Contact hole is formed so as to be divided, by the relaying pad 33, into two parts which extend upwards and downwards, respectively, with respect to the relaying pad 33, and connection wiring 34 and connection wiring 35 are provided in the contact holes. In this way, it is possible to reduce respective diameters of the contact holes associated with the connection wiring 34 and the connection wiring 35, and to make respective depths of the contact holes shallower, as compared with the case of providing the single contact hole penetrating all of the insulation layers. As such, it is possible to restrain aspect ratios of the respective contact holes. This allows an easier realization of the high-density integration of circuits. Further, since the depths of the contact holes become shallower, it becomes possible to reduce the occurrences of problems such as connection failure of the connection wiring within the contact holes.

The following description deals with a method for fabricating the semiconductor device 1.

According to the method for the fabricating the semiconductor device 1 of the present embodiment, a single-crystal silicon substrate 10 is formed. In the single-crystal silicon substrate 10, a portion, which becomes the single-crystal silicon thin film transistor 11 after undergoing a thin-film process, has been incorporated. Such a portion to become the single-crystal silicon thin film transistor 11, on the single-crystal silicon substrate 10, is transferred to the insulator substrate 2.

First, the following description deals with a method for fabricating the single-crystal silicon substrate 10 in which the portion to become the single-crystal silicon thin film transistor 11 has been incorporated, with reference to FIG. 2(a) through FIG. 2(e).

Figure 2:
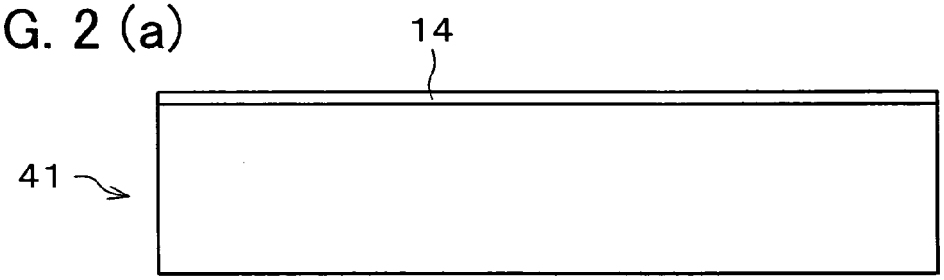
FIG. 2(a) through FIG. 2(e) are cross sectional views showing steps of fabricating a single-crystal silicon substrate in which a portion to become a single-crystal silicon thin film transistor is separately incorporated.
Figure 2:
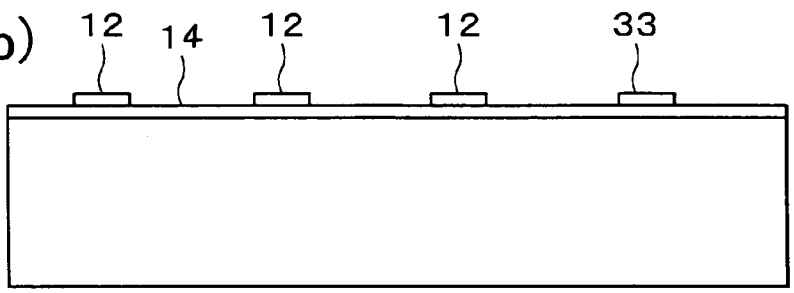
Figure 2:
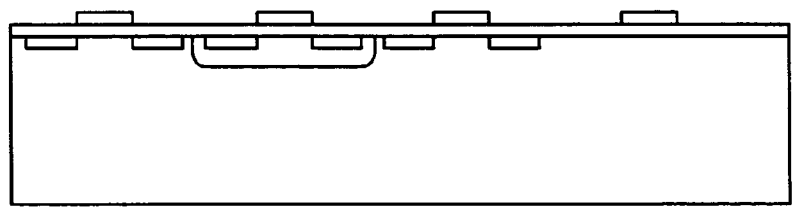
Figure 2:
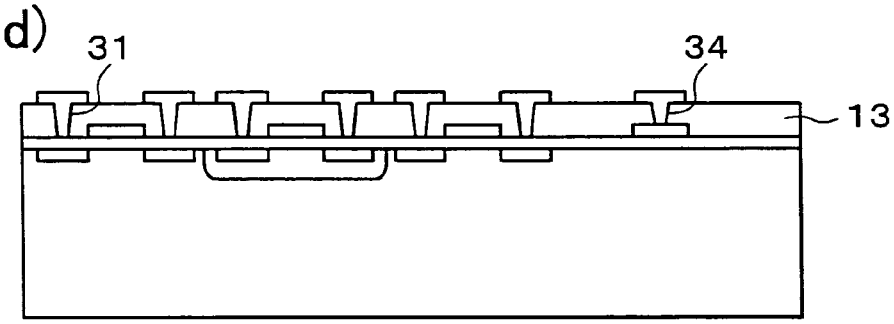
Figure 2:
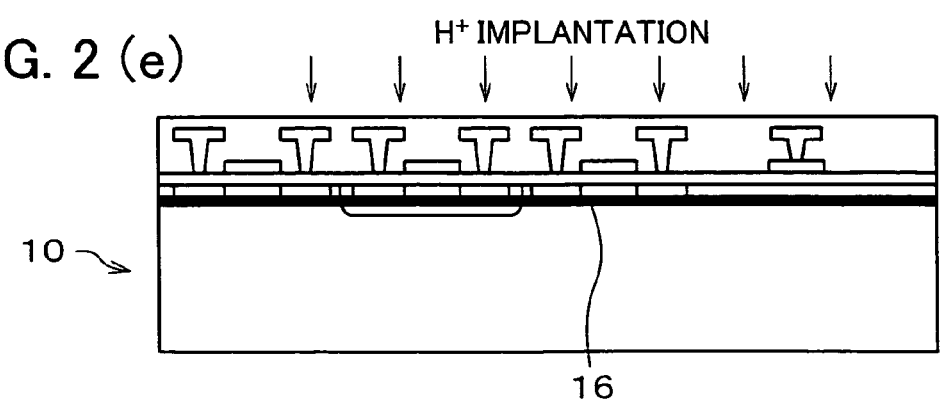

At the outset, as shown in FIG. 2(a), a gate insulation film 14 is formed, using a thermal oxidation method, on a single-crystal silicon wafer 41 cleaned by an ordinary cleaning method (e.g. RCA cleaning). Note that the gate insulation film 14 has a thickness falling within a range of 3 nm to 50 nm. An oxidation method may be a pyrogenic oxidation method, an HCl oxidation method, or the like.

Further, an oxidized film for device isolation is formed in a region other than a region where the transistor is formed. A channel dope, which controls a threshold voltage like a well, is made by ion implantation into the region in which the transistor is formed.

Next, as shown in FIG. 2(b), a CVD method or other method is used to form, on the gate insulation film 14, a gate electrode layer, made of, for example, a doped polysilicon film having a thickness of approximately 200 nm to 300 nm. An ordinary photolithography is conducted to pattern the gate electrode layer thus formed. This allows a formation of a gate electrode 12. It is easy to achieve a line width of approximately 0.5 µm, because the line width of the gate electrode 12 is patterned in an IC, LSI processing line.

The formation of the gate electrode layer may be realized by forming a film of non-doped polysilicon using the CVD method, and then lowering a resistance of the non-doped polysilicon via n+ diffusion process.

Note that, in the present embodiment, the patterning of the gate electrode layer allows not only the gate electrode 12 to be formed, but also the relaying pad 33 to be formed in a preliminary designed position, at the same time.

After patterning the gate electrode 12 and the relaying pad 33, phosphorus, boron, or the like is implanted to, in a self-aligning manner, a portion to become source and drain section. Then, the semiconductor layer thus doped is activated by a heat treatment under a temperature of approximately 1000° C. An LDD (Lightly Doped Drain) may be formed, depending on the circumstances.

In a case of a fine transistor whose gate length is approximately 0.5 µm or less, (i) an implanting of P ion having a medium concentration (falling within a range of approximately 1E12/cm to 2) is carried out in the case of NMOS transistor, whereas an implanting of B ion having a medium concentration (approximately 1E12/cm to 2) is carried out in the case of PMOS transistor, (ii) a side wall of an oxidized film is formed at an end of the gate electrode, (iii) an impurity implantation is carried out with shallow and less dispersing by implanting As ion (in the case of NMOS transistor) having a high concentration (approximately 1E15/cm to 2), whereas by implanting BF2 ion (in the case of PMOS transistor) having a high concentration (approximately 1E15/cm to 2), thereby realizing an LDD structure. A HALO implantation may be carried out according to need.

Then, as shown in FIG. 2(d), after the interlayer insulator film (planarizing layer) 13 is formed so as to have a thickness of approximately 300 nm, contact holes are formed in the interlayer insulator film 13, and connection wiring 31 and connection wiring 34 are formed. Further, the interlayer insulator film 13 made of $SiO_2$ is formed so as to have a thickness of approximately 300 nm. Planarization is carried out by the CMP method with respect to the interlayer insulator film 13 in which the connection wiring 31 and the connection wiring 34 have been formed.

Further, as shown in FIG. 2(e), an implanting of hydrogen ion is carried out to form a hydrogen-ion-implanted portion 16. The implanting of the hydrogen ion is carried out while applying an acceleration voltage of 100 keV to 150 keV, and maintaining a dose amount of approximately $5 \times 10^{16}/cm^2$. It is more advantageous in terms of uniform silicon film thickness that the implanting of the hydrogen ion is carried out before the formation of the interlayer insulator film 13. Thus, the implanting of the hydrogen ion may be carried out before the formation of the interlayer insulator film 13. Note that, instead of implanting of the hydrogen ion, an implanting of the hydrogen ion and ion of the rare gas such as helium may be carried out. In this case, hydrogen-caused deterioration in degree of activity of an acceptor is alleviated. The silicon wafer having portion to be transferred is cut out in a desired size, so as to form the single-crystal silicon substrate 10. This allows the single-crystal silicon thin film transistor 11 to be transferred to the insulator substrate 2. Note that a process for cutting out the silicon wafer is not shown in FIG. 2(e).

Next described, with reference to FIG. 3(a) through FIG. 3(d), is a method for fabricating the semiconductor device 1. Note that FIG. 3(a) through FIG. 3(d) omit the relaying pad 33, the connection wiring 31, and the connection wiring 34, in order to simplify the drawing.

Firstly, as shown in FIG. 3(a), an $SiO_2$ film 3, having a thickness of about 100 nm, is deposited on the entire surface of an insulator substrate 2 by plasma CVD (chemical vapor deposition), using TEOS and $O_2$. The formation of the $SiO_2$ film 3 prevents contamination from the insulator substrate 5 which is made of a glass substrate, or the like.

Next, as shown in FIG. 3(b), cleaning, using SC-1 liquid, and activating are respectively carried out with respect to the insulator substrate 2 and the cut-out single-crystal silicon substrate 10. Then, a side of the hydrogen-ion-implanted portion 16 of the single-crystal silicon substrate 10 is aligned in a predetermined position, and is bonded with the insulator substrate 2 at a room temperature.

When the insulator substrate 2 of a light transmitting non-crystalline substrate (with coating film made of a silicon oxide film), and the single-crystal silicon substrate 10 (an oxidized film $SiO_2$ has been formed on the surface of the substrate 10, and the planarization has been carried out with respect to such an oxidized film $SiO_2$), are bonded with each other without an adhesive agent, it is very important what degree of cleaning and what degree of activity each surface of the substrates has. As such, prior to the bonding of the two substrates, these substrates are cleaned with a liquid called SC1 liquid, and then dried.

SC1 liquid is prepared by mixing commercially-available ammonia ($NH_4OH$: 30%), hydrogen peroxide ($H_2O_2$:30%), and deionized water ($H_2O$). For example, the above listed water and solution are mixed at a ratio of 5 : 12 : 60. The liquid temperature of SC1 may be a room temperature. The cleaning is carried out by soaking the substrate into the SC1 liquid for 5 min. The substrate is then cleaned using flowing pure water (specific resistance of 10 MΩcm or more) for 10 min., and is promptly dried using a spin dryer, or the like. After the cleaning and drying process, the insulator substrate 2 and the single-crystal silicon substrate 10 are spontaneously bonded with each other, by bringing them together, and slightly pressing against each other.

Van der waals force, and hydrogen bonding respectively contribute to the bonding of the single-crystal silicon substrate 10 with the insulator substrate 2, without an adhesive agent.

Figure 4:
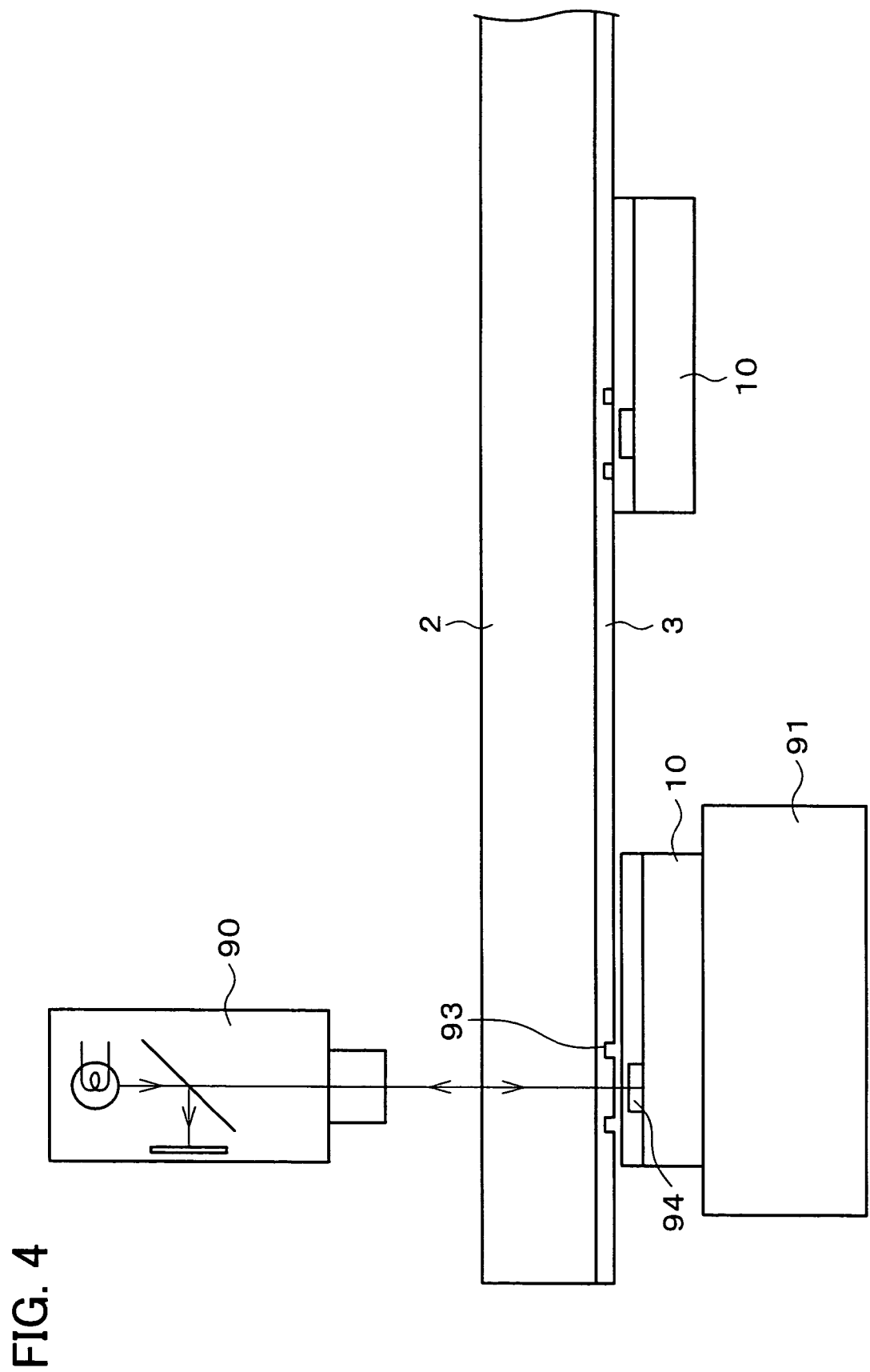
FIG. 4 is a schematic diagram showing a step of positioning a single-crystal silicon and a glass substrate in the fabrication method of the present invention at room temperature.

Further, as shown in FIG. 4, an alignment of the single-crystal silicon substrate 10 and the insulator substrate 2, when bonding them with each other, is carried out by detecting an alignment mark 94 on the single-crystal silicon substrate 10 and an alignment mark 93 on the insulator substrate 2 while illuminated by visible light from the side of the insulator substrate 2 via the insulator substrate 2. In an example shown in FIG. 4, the alignment mark 94, on the single-crystal silicon substrate 10 on a positioning stage 91, is detected with the use of a CCD camera 90 provided in an optical microscope. A result thus detected is ultimately converted into an electric signal, and the electric signal is processed.

In a conventional method in which the positioning is carried out by irradiating infrared light via a silicon substrate, an alignment was carried out by detecting alignment marks through a silicon wafer which has a surface for scattering the light. Note that an IC, etc. is opaque with respect to the visible light and the UV light, and that such a surface is not a mirror surface because of prevention of attaching. As such, the conventional method has a problem of poor accuracy.

In contrast, in the semiconductor device of the present embodiment, for example, an insulator substrate is transparent with respect to the visible light having a shorter wavelength and the UV light, and the alignment marks 93 and 94 are detected through glass having a surface which does not scatter the light. As such, it becomes possible to carry out positioning more accurately than the conventional method.

After the single-crystal silicon substrate 10 and the insulator substrate 2 are bonded with each other, a temperature of the hydrogen-ion-implanted portion 16 is raised higher than a temperature which causes hydrogen to escape away from the single-crystal silicon substrate 10 (i.e., lamp annealing or annealing with an electric furnace at a temperature of 450° C. to 600° C. for 30 min). This allows an unnecessary portion 41a of the single-crystal silicon substrate 10 to be cleaved and exfoliated from the hydrogen-ion-implanted portion 16 (see FIG. 3(c)), Further, the heat treatment causes a reaction of Si—OH+—Si—OH→Si—O—Si+$H_2O$. This reaction takes place at an interface of the single-crystal silicon substrate 10 and the insulator substrate 2 which are bonded with each other by Van der Waals force and/or hydrogen bonding. This allows the bonding of the substrates to be changed to the strong bonding of atoms.

The single-crystal silicon thin film transistor 11 is bonded with the insulator substrate 2, via the inorganic insulator film 3. Therefore, it is possible to surely avoid that the single-crystal silicon thin film 15 is contaminated, as compared with the conventional method in which an adhesive agent is used for bonding.

Next, the unnecessary portion of the single-crystal silicon thin film 15, which is remained on the insulator substrate 2 due to the exfoliation, is removed by etching. This causes formation of island shaped single-crystal silicon. Then, a damaged layer on the surface is removed by isotropic plasma etching or wet etching. In the present embodiment, the wet etching is carried out. More specifically, the wet etching uses buffered hydrofluoric acid for lightly etching by an etching amount of approximately 10 nm, thus removing the damaged layer on the surface. This allows part of an MOSTFT to be formed on the insulator substrate 2, the MOSTFT being made of the single-crystal silicon thin film 15 whose thickness is approximately 50 nm.

Then, as shown in FIG. 3(d), deposition of $SiO_2$ by plasma CVD is carried out using $SiH_4$ and $N_2O$, so as to deposit on the entire interlayer substrate 2 a second interlayer insulator film 4 whose thickness is approximately 200 nm. Further, deposition of $SiO_2$ by plasma CVD is carried out using $SiH_4$ gas to deposit a non-crystalline silicon film 6 on the entire surface of the interlayer insulator film 4, the non-crystalline silicon film 6 whose film thickness is approximately 50 nm.

Next, as shown in FIG. 3(e), the non-crystalline silicon film 6 is heated and crystallized by excimer laser light. This allows a non-crystalline silicon layer to be grown from a non-crystalline silicon film, and the polycrystalline silicon thin film 6' to be formed. Note that it is preferable that the excimer laser light is projected except the region, where the single-crystal silicon thin film transistor 11 is transferred.

As shown in FIG. 3(f), in order to leave portions to become an activation region of the device, the unnecessary portions of the polycrystalline silicon film 6' are removed by etching, thereby forming an island shaped pattern of polycrystalline silicon film 6'. The polycrystalline silicon film 6' thus patterned will become the semiconductor layer of the polycrystalline silicon thin film transistor 21, i.e., the polycrystalline silicon film 22.

Further, plasma CVD is carried out using the mixed gas of TEOS and oxygen, to deposit the $SiO_2$ film having a thickness of approximately 350 nm. This $SiO_2$ film is etched back to approximately 400 nm, by an anisotropic etching called RIE (reactive ion etching). Then, plasma CVD is carried out using $SiH_4$ and $N_2O$, to form an $SiO_2$ film 23 having a thickness of approximately 60 nm, as the gate insulation film of the polycrystalline silicon thin film transistor 21. At this point, side walls are formed at an end of the pattern of the single-crystal silicon thin film 15 and at an end of the pattern of the polycrystalline silicon thin film 22, respectively. The $SiO_2$ film 23 becomes a gate oxidized (film) for the polycrystalline silicon thin film transistor 21. Further formed on the $SiO_2$ film 23 is the gate electrode 24 of the polycrystalline silicon thin film transistor 21.

Next, as shown in FIG. 3(g), plasma CVD is carried out using the mixed gas of TEOS and $O_2$ (oxygen), so as to form an $SiO_2$ film 5, having a thickness of approximately 350 nm, as the interlayer planarizing insulation film.

Then, as shown in FIG. 3(h), in the formation region of the polycrystalline silicon thin film transistor 21 serving as the deposited device, contact holes are provided which penetrate the interlayer insulator film 4 and the interlayer planarizing insulation film 5. The connection wire 32 made of such as AlSi is formed as shown in FIG. 3(i), in the contact hole.

Further, in the formation region of the single-crystal silicon thin film transistor 11 serving as the transferred device, the connection wire 35 is provided shown in FIG. 1 (not shown), under the same process as the connection wire 32 is provided. The semiconductor device 1 of the present embodiment is thus completed.

Note that the semiconductor device of the present invention is not limited to the configuration described in the present embodiment. For example, the present invention may be adapted to an modified example described as follows.

The foregoing semiconductor device 1 is provided with the relaying pad 33 in the layer in which the gate electrode 12 of the single-crystal silicon thin film transistor 11 is provided. Alternatively, a relaying pad section may be provided in a layer in which the semiconductor layer 15a of the single-crystal silicon thin film transistor 11 is provided. In this case, the relaying pad section can be formed by carrying out a doping of phosphorus or boron with respect to a region where the relaying pad section is formed within the single-crystal silicon thin film 15.

Further, in the foregoing semiconductor device 1, the transferred device is the single-crystal silicon thin film transistor, and the deposited device is the polycrystalline silicon thin film transistor. However, in the present invention, the types of the transferred device and the deposited device are not limited to specific ones, respectively.

Further, a configuration of each transistor used in the transferred device and the film formation device, is not limited to a specific one. Namely, the transistor may be any one of (i) a MOS thin film transistor having a bottom-gate configuration, (ii) a MOS thin film transistor having a top-gate configuration, and (iii) a bipolar transistor.

Further, in the foregoing fabrication method, the interlayer insulator film 4 and the non-crystalline silicon film 6 are deposited after the unnecessary portions 41a of the single-crystal silicon substrate 10 are exfoliated (See FIG. 3(c) or FIG. 3(d)). However, the present invention is not limited to this. For example, after bonding of the single-crystal silicon substrate 10 with the insulator substrate 2, the interlayer insulator film 4 and the non-crystalline silicon film 6 may be deposited on the entire surface of the insulator substrate 2, prior to exfoliating the unnecessary portion 41a of the single-crystal silicon substrate 10 from a surface of the hydrogen-ion-implanted section 16.

Further in the foregoing fabrication method, the deposited device is formed on the insulator substrate, after transferring the transferred device on the insulator substrate. The present invention is not limited to this. Alternatively, the deposited device may be formed on the insulator substrate prior to transferring the transferred device on the insulator substrate. In such case, etching may be carried out to remove a predetermined portion of the non-crystalline silicon film, while the semiconductor layer of the_deposited_device is a non-crystalline silicon film. Then, the predetermined portion may be bonded with a silicon substrate in which a configuration of a single-crystal silicon device is incorporated. Then, as usage, the deposited device may adopt the semiconductor layer as the non-crystalline silicon film without change, or may adopt a polycrystalline silicon film obtained by crystallizing the semiconductor layer.

As described above, a semiconductor device of the present invention is arranged in a region where the single-crystal thin film device is formed so that a relaying pad is formed in a predetermined portion in an insulation layer, and the relaying pad is connected to metal wiring or its equivalent wiring which is connected to a predetermined position of a single-crystal layer of the single-crystal thin film device, via the contact hole. Further, the relaying pad may be connected with metal wiring of the non-crystalline silicon thin film device.

According to the semiconductor device, in the formation region of the single-crystal thin film device, the single-crystal thin film device is connected to the metal wiring in the non-single crystal silicon device having the active layer made of the polycrystalline silicon or the like formed on the insulator substrate. As such, it is required that the contact hole be so provided as to penetrate all of the insulation layers in the formation region, and that the connection wiring be provided in the contact hole.

To meet the requirements, in the foregoing configuration, the contact hole is provided so as to be divided, by the relaying pad, into two parts, one extending upwards and the other extending downwards with respect to the relaying pad provided in the insulation layer, instead of forming the contact hole penetrating all of the insulation layer in the formation region of the transferred device. As such, the diameter of the contact hole becomes smaller than that of the contact hole penetrating all of the insulation layer without the relaying pad, thereby restraining the aspect ratio of the contact hole, and thereby reducing the size of the contact hall. This gives rise to an advantageous in high-density integration of circuits. Further, the contact hole becomes shallow. This allows reduction of the occurrences of problems such as connection failure of the connection wiring within the contact hole.

Further, in the foregoing semiconductor device, the relaying pad is formed in a layer in which the gate electrode of the single-crystal thin film device is formed. As such, it is possible to simultaneously form the relaying pad when the gate electrode of the single-crystal thin film device is formed in film formation and patterning of a conductive layer. Thus, it is not necessary to provide extra steps for forming the relaying pad.

Further, in the foregoing semiconductor device, the relaying pad is formed in a layer in which the semiconductor layer of the single-crystal thin film device is formed. As such, it is possible to form the relaying pad and the semiconductor layer at the same time, by doping the formation region of the relaying pad when the semiconductor layer of the single-crystal thin film device is formed by doping of the impurities. Thus, it is not necessary to provide extra steps for forming the relaying pad.

Further, as described above, a method for fabricating a thin film semiconductor device, said device comprising an insulator substrate which includes (i) a single-crystal thin film device having an active layer made of a single-crystal silicon, and (ii) a non-single-crystal silicon thin film device having an active layer made of a non-single-crystal silicon, said method, comprising the steps of:

(i) forming at least a part of the single-crystal thin film device;

(ii) (a) forming an $SiO_2$ layer for covering a surface of single-crystal silicon to which, under a predetermined energy and a predetermined concentration, an implantation of hydrogen ion, or an implantation of hydrogen ion plus rare gas ion such as He gas ion has been carried out, (b) planarizing and activating a surface of the $SiO_2$ layer, (c) bonding the $SiO_2$ layer with an insulator substrate made of such as glass, and (d) conducting a heat treatment so that cleavage and separation occur from a portion to which the ion implantation has been carried out, thereby carrying out transfer;

(iii) forming a non-single-crystal device on the insulator substrate before or after the step (ii); and (iv) forming a contact hole in an insulation layer, and forming connection wiring via the contact hole, the step (i) including the steps of:

(v) forming a relaying pad in a predetermined portion in an insulation layer of the single-crystal thin film device, and (vi) connecting the relaying pad, via the contact hole, with metal wiring or its equivalent wiring which is connected with a predetermined position of a single-crystal layer of the single-crystal thin film device, and connecting the relaying pad with metal wiring of the non-single-crystal silicon thin film device via the contact hole, the step (iv) including the step of forming second connection wiring in the relaying pad, the second connection wiring causing the relaying pad to be connected, via the contact hole, to the metal wiring of the non-single-crystal silicon thin film device.

The fabrication method enables the fabrication of the semiconductor having the foregoing configuration. This gives rise to an advantage in the high-density integration of circuits. It is also possible to reduce the occurrences of the problems such as the connection failure of the connection wiring within the contact hole.

Further, in the foregoing fabrication method of the semiconductor device, the fifth step is carried out in the same step in which (i) the gate electrode of the single-crystal thin film device is formed, or (ii)the semiconductor layer of the single-crystal thin film device is formed. Thus, it is not necessary to provide extra steps for forming the relaying pad.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A thin film semiconductor device, comprising:

an insulator substrate including (i) a single-crystal thin film device having an active layer made of a single-crystal silicon, and (ii) a non-single-crystal silicon thin film device having an active layer made of a non-single-crystal silicon;

a contact hole, and a relaying pad formed in a predetermined portion in an insulation layer of the single-crystal thin film device, in a region where the single-crystal thin film device is formed, the relaying pad being connected, via the contact hole, with metal wiring or its equivalent wiring which is connected with a predetermined position of a single-crystal layer of the single-crystal thin film device.

2. The thin film semiconductor device as set forth in claim 1, wherein the relaying pad is connected with metal wiring of the non-single-crystal silicon thin film device.

3. The thin film semiconductor device as set forth in claim 1, wherein:

the relaying pad is formed in a layer in which a gate electrode of the single-crystal thin film device is formed.

4. The thin film semiconductor device as set forth in claim 1, wherein:

the relaying pad is formed in a layer in which the active layer of the single-crystal thin film device is formed.

5. The thin film semiconductor device as set forth in claim 1, wherein the relaying pad is formed in a layer in which an active layer or a gate layer of the single-crystal thin film device is formed, and the relaying pad is connected via the contact holes with the metal wirings of different layers above and below the relaying pad.

6. The thin film semiconductor device as set forth in claim 1, wherein:

the contact hole is formed below a source or a drain in the single-crystal thin film device; and the contact hole is formed above a source or a drain in the non-single-crystal silicon thin film device.

* * * * *